United States Patent
Congreve et al.

(10) Patent No.: US 10,825,996 B2
(45) Date of Patent: Nov. 3, 2020

(54) TUNABLE LIGHT EMITTING DIODES UTILIZING QUANTUM-CONFINED LAYERED PEROVSKITE EMITTERS

(71) Applicant: MASSACHUSETTS INSTITUTE OF TECHNOLOGY, Cambridge, MA (US)

(72) Inventors: Daniel Norbert Congreve, Cambridge, MA (US); William A. Tisdale, Belmont, MA (US); Mark Clayton Weidman, Cambridge, MA (US); Michael Seitz, Meilen (CH)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 16/336,892

(22) PCT Filed: Sep. 27, 2017

(86) PCT No.: PCT/US2017/053840
§ 371 (c)(1),
(2) Date: Mar. 26, 2019

(87) PCT Pub. No.: WO2018/064235
PCT Pub. Date: Apr. 5, 2018

(65) Prior Publication Data
US 2019/0259961 A1    Aug. 22, 2019

Related U.S. Application Data

(60) Provisional application No. 62/400,501, filed on Sep. 27, 2016.

(51) Int. Cl.
*H01L 51/00* (2006.01)
*H01L 51/56* (2006.01)
(Continued)

(52) U.S. Cl.
CPC .......... *H01L 51/0077* (2013.01); *C09K 11/06* (2013.01); *H01L 51/56* (2013.01);
(Continued)

(58) Field of Classification Search
CPC .............. C09D 127/18; H01L 51/5012; H01L 51/5096; H01L 51/0077; H01L 51/004; H01L 51/005; H01B 1/125; H01B 1/127; C09K 11/06; C09K 2211/188; H01G 9/2009; Y02E 10/549
See application file for complete search history.

(56) References Cited

U.S. PATENT DOCUMENTS 6,420,056 B1   7/2002   Chondroudis et al.
6,831,406 B1   12/2004  Fukuyama et al.
(Continued)

OTHER PUBLICATIONS

International Search Report and Written Opinion for Application No. PCT/US2017/053840 dated Dec. 8, 2017.
(Continued)

*Primary Examiner* — Dung A. Le
(74) *Attorney, Agent, or Firm* — Steptoe & Johnson LLP

(57) ABSTRACT

A light emitting device can include a layered perovskite, thereby determining the color of emission of the device.

9 Claims, 9 Drawing Sheets

(51) Int. Cl.
*H05B 33/14* (2006.01)
*C09K 11/06* (2006.01)
*H01L 51/50* (2006.01)

(52) U.S. Cl.
CPC ........ *H05B 33/14* (2013.01); *C09K 2211/188* (2013.01); *H01L 51/5012* (2013.01)

(56) References Cited

U.S. PATENT DOCUMENTS

| | | |
|---|---|---|
| 2015/0136232 A1 | 5/2015 | Snaith et al. |
| 2015/0249170 A1* | 9/2015 | Snaith .................... H01L 51/422 |
| | | 136/256 |
| 2017/0005296 A1* | 1/2017 | Soci ..................... H01L 51/5012 |
| 2017/0222162 A1* | 8/2017 | Lee ...................... H01L 51/0077 |
| 2018/0047928 A1* | 2/2018 | Kim ....................... C09K 11/584 |
| 2019/0259962 A1* | 8/2019 | Lee ......................... C01G 21/16 |

OTHER PUBLICATIONS

Preliminary Report on Patentability for Application No. PCT/US2017/053840 dated Apr. 7, 2019.

\* cited by examiner

—/— Absorption    ---/--- Photoluminescence

—/— Absorption    ---/--- Photoluminescence

TUNABLE LIGHT EMITTING DIODES UTILIZING QUANTUM-CONFINED LAYERED PEROVSKITE EMITTERS

CLAIM FOR PRIORITY

This application claims priority under 35 USC 371 to International Application No. PCT/US2017/053840, filed on Sept. 27, 2017, which claims the benefit of prior U.S. Provisional Application No. 62/400,501 filed on Sept. 27, 2016, each of which is incorporated by reference in its entirety.

TECHNICAL FIELD

This invention relates to light emitting diodes.

BACKGROUND

Organic-inorganic perovskite materials are attractive candidates for optoelectronic devices.

SUMMARY

In one aspect, a light emitting device can include a first electrode, a second electrode, and a layered perovskite between the first electrode and the second electrode.

In certain embodiments, the layered perovskite can include a lead bromide, a lead iodide, or a mixture thereof.

In certain embodiments, the layered perovskite can have the formula $L_2[MAPbX_3]_{n-1}PbX_4$ where n represents a number of metal-halide layers in thickness, L is an alkyl ammonium, MA is an organic cation, and X is bromide or iodide.

In certain embodiments, the layered perovskite can have 1, 2 or 3 layers.

In another aspect, a method of adjusting the color of emission from a light emitting device includes selecting a layered perovskite, depositing the layered perovskite onto a first electrode, and contacting a second electrode with the layered perovskite opposite the first electrode.

In certain embodiments, selecting the layered perovskite can include tuning the thickness of the layers of the perovskite.

In certain embodiments, selecting the layered perovskite can include choosing anions to arrive at the color of emission.

In certain embodiments, choosing anions can include mixing halides.

In certain embodiments, selecting the layered perovskite can include choosing a number of layers of the layered perovskite to arrive at the color of emission.

In certain embodiments, the layered perovskite can be chosen to have 1, 2 or 3 layers.

In certain enbodiments, the layered perovskite can have the formula $L_2[MAPbX_3]_{n-1}PbX_4$ where n represents a number of metal-halide layers in thickness, L is an alkyl ammonium, MA is an organic cation, and X is bromide or iodide.

Other aspects, embodiments, and features will be apparent from the following description, the drawings, and the claims.

BRIEF DESCRIPTION OF THE DRAWINGS

FIG. 1A shows t thin layered perovskites terminated by ligands show thickness dependent and blue-shifted emission due to quantum confinement. FIG. 1B show the device structure of PeLEDs. PEDOT:PSS and the layered perovskites are spun on top of ITO, followed by thermal evaporation of TmPyPB and LiF/Al. Energy levels from Liang, D. et al. *ACS Nano* 2016, 10, 6897-6904 and Yoo, S.-J. et al. *J. Mater. Chem. C.* 2013, 1 (11), 2217-2223. FIG. 1C shows a scanning electron micrograph (SEM) cross-section of the device. Scale bar is 100 nm.

FIG. 3A Electroluminescence of the fabricated devices (solid lines). Photoluminescence spectra of bulk-like nanoparticles (dashed lines) are included for reference. The blue-shift due to quantum confinement is evident in both bromide- and iodide-based material systems. From left to right the solid curves are L=200% bromide, L=100% bromide, L=180% iodide, and L=140% iodide; FIG. 3B External quantum efficiencies of the four devices shown in FIG. 3A; FIG. 3C Current-voltage curves.

FIG. 4A Under no applied bias, unpackaged layered perovskite LEDs show stability under UV excitation in air. The bromide signal dropped by approximately 4% over half an hour, while the iodide slightly increased. FIG. 4B Time-resolved trace of the integrated PL intensity under periodic application of bias for an L=180% iodide device. Both 2 V and 4 V applied bias cause reversible degradation, which recovers on the order of seconds, whereas 6 V of applied bias permanently destroys the material.

DETAILED DESCRIPTION

Figure 1A:
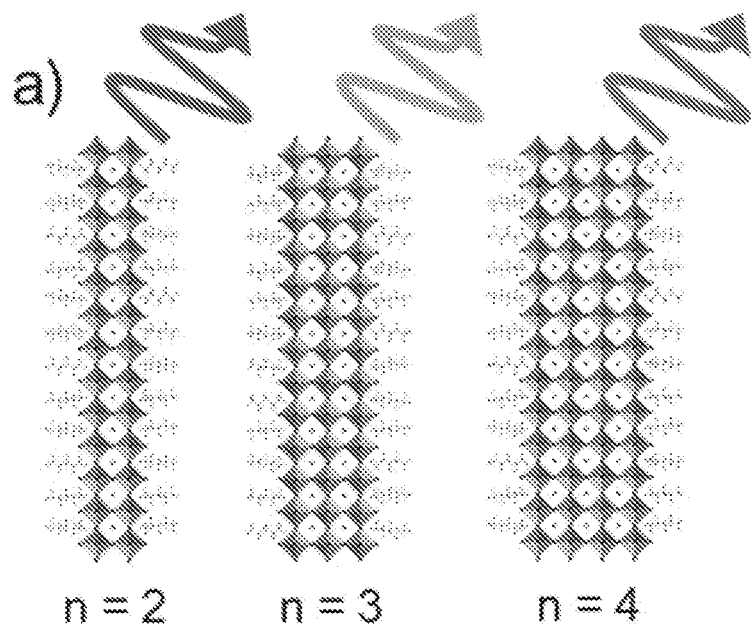
FIGS. 1A-1D show materials and devices described herein.

Organic-inorganic perovskites have been shown to have excellent optoelectronic properties. Further, layered perovskites have been demonstrated, utilizing quantum confinement to achieve emission blue-shifted from the bulk bandgap. Here, this blue-shift can be tuned to build LEDs that span the visible spectrum. Electroluminescence from thicker layers dominates emission is demonstrated from mixed-thickness devices. It is also demonstrated that the addition of excess ligand is necessary to drive emission toward thinner layers. By tuning the thickness of the layers, LEDs are built with emission ranging from 440 nm to 650 nm) utilizing the lead iodide and lead bromide systems. Blue emission can utilize the lead bromide system and orange emission can utilize the lead iodide system. Finally, these materials are demonstrated to suffer reversible degradation under an applied electric field. The spectrally narrow emission, combined with the favorable electronic properties of perovskite materials and access to shorter emission wavelengths through quantum confinement demonstrate the promise of these materials as a new platform for low cost, high performance light emitting devices.

Organic-inorganic perovskite materials are attractive candidates for optoelectronic devices due to their solution processability, long carrier diffusion lengths, and low trap densities. See, Stranks, S. D. et al. *Science*. 2013, 342 (6156), 341-344; Shi, D. et al. *Science*. 2015, 347 (6221), 519-522. Indeed, these materials have been used to demonstrate high efficiency solar cells, LEDs, and lasers. See, Yang, W. S. et al. *Science*. 2015, 348 (6240), 1234-1237; Liu, M. et al. *Nature* 2013, 501 (7467), 395-398; Kim, Y.-H. et al. *Adv. Mater.* 2015, 27 (7), 1248-1254; Cho, H. et al. *Science*. 2015, 350 (6265), 1222-1225; Wang, J. et al. *Adv. Mater.* 2015, 27 (14), 2311-2316; and Xing, G. et al. *Nat. Mater.* 2014, 13 (5), 476-480. Recently, interest in nanostructured perovskites has grown, with efforts in QD quantum dots, 1D nanowires, and 2D nanoplatelets driving improvements in both solar cell and LED performance. See, Li, G. et al. *Nano Lett.* 2015, 15 (4), 2640-2644; Li, G. et al. *Adv. Mater.* 2016, 28 (18), 3528-3534; Im, J.-H. et al. *Nanoscale* 2011, 3 (10), 4088-4093; Protesescu, L. et al. *Nano Lett.* 2015, 15 (6), 3692-3696; Zhu, H. et al. *Nat Mater* 2015, 14 (6), 636-642; Tyagi, P. et al. *J. Phys. Chem. Lett.* 2015, 6 (10), 1911-1916; Sichert, J. A. et al. *Nano Lett.* 2015, 15 (10), 6521-6527; Dou, L. et al. *Science*. 2015, 349 (6255), 1518-1521; Weidman, M. C. et al. *ACS Nano* 2016, 7830-7839; Akkerman, Q. A. et al. *J. Am. Chem. Soc.* 2016, 138 (3), 1010-1016; Bekenstein, Y. et al. *J. Am. Chem. Soc.* 2015, 137 (51), 16008-16011; and Tsai, H. et al. *Nature* 2016, 536, 312-316; and Yuan, M. et al. *Nat. Nanotechnol.* 2016, 11, 872-877.

Of particular interest are two dimensional layered perovskites. See, Tabuchi, Y et al. *J. Phys. Chem. Solids* 2000, 61 (6), 837-845; and Hong, X. et al. *Phys. Rev. B* 1992, 45 (12), 6961-6964.

Organic-inorganic perovskite materials are described, for example, in U.S. patent application Ser. No. 15/585,912, which is incorporated by reference in its entirety.

The perovskite material can have the formula (I):

$$L_2[ABX_3]_{m-1}BX_4 \qquad (I)$$

wherein L is an organic ligand, A is a monovalent metal or organic molecular cation, B is a divalent metal cation, X includes a halide, and m−1 is the number of unit cells in thickness, wherein m is 1, 2, 3 or 4. For example, nanoplatelets can be the form $L_2[ABX_3]_{m-1}BX_4$ was synthesized, where L is an organic ligand (octylammonium, butylammonium), A is a monovalent metal or organic molecular cation (cesium, methylammonium, formamidinium), B is a divalent metal cation (lead, tin), X is a halide anion (chloride, bromide, iodide), and mn−1 is the number of unit cells in thickness.

These materials are stacks of two dimensional sheets just a few atomic layers thick with long-chain capping ligands on either side; see FIG. 1A. They take the chemical form $L_2[MAPbX_3]_{n-1}PbX_4$ where n represents the number of metal-halide layers in thickness, L is a butylammonium ligand, MA is the organic cation methylammonium, and X is the halide anion bromide or iodide. The extreme thinness of these materials in the z direction leads to large exciton binding energies and quantum confinement, blue-shifting the bandgap. See, Hong, X. et al. *Phys. Rev. B* 1992, 45 (12), 6961-6964. This tunability allows for increased flexibility in perovskite device design. Additionally, high performance solar cells with reduced degradation have been demonstrated using these materials. See, Tsai, H. et al. *Nature* 2016, 536, 312-316, and Quan, L. N. et al. *J. Am. Chem. Soc.* 2016, 138 (8), 2649-2655. Recently, violet and blue layered perovskite LEDs have been demonstrated using the quantum confined lead bromide system. See, Liang, D. et al. *ACS Nano* 2016, 10, 6897-6904, Byun, J. et al. *Adv. Mater.* 2016, 2-7, and Cheng, L., et al. *Chinese Chem. Lett.*, 2016, 28, 3-5. Utilization of layered structures has also been shown to greatly increase the infrared emission from bulk-like lead iodide perovskites in an energy funnel structure. See, Yuan, M. et al. *Nat. Nanotechnol.* 2016, 11, 872-877. Here, we seek to demonstrate the flexibility of the layered perovskites system by building LEDs that span the entire visible spectrum.

Figure 1B:
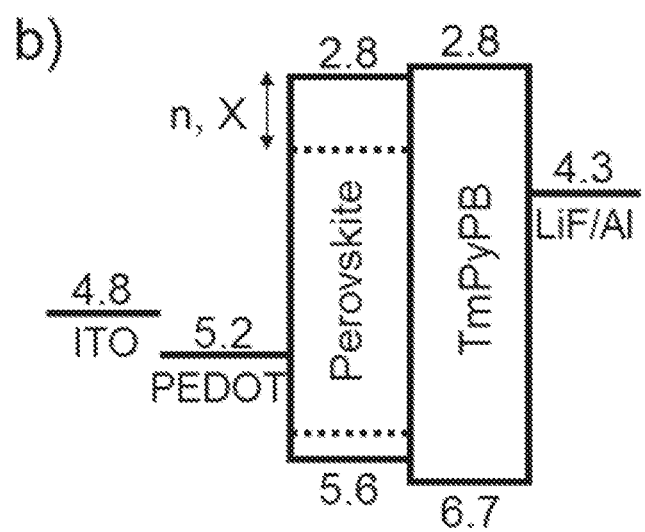
Figure 1C:
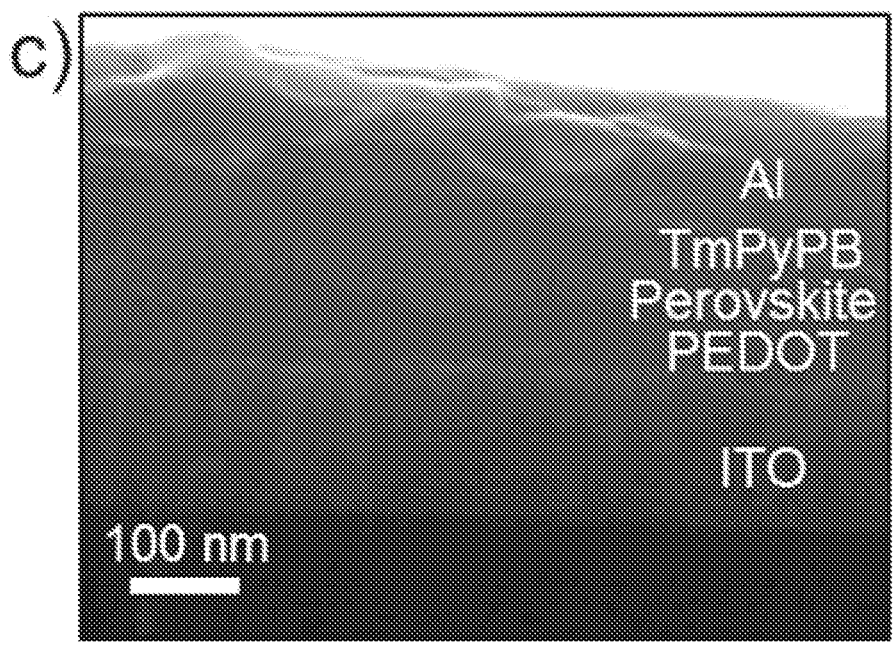

The structure of the device described herein is presented in FIG. 1B. PEDOT:PSS was utilized for the hole transport layer. PEDOT was spun onto an ITO coated glass slide at 4000 rpm for 45 s followed by a bakeout in nitrogen at 135° C. for 30 minutes. The perovskite active layer was deposited by spin coating directly from a solution of precursor salts dissolved in dimethylformamide (DMF) at 3000 rpm for 60 s. The precursors were mixed stoichiometrically according to the target thickness of n=2, except for the butylammonium ligand, L (expressed as a percentage of the stoichiometric ratio), which was added in excess to favor the formation of thinner layers. During spin coating, a color change was observed after 30-45 seconds, indicating successful formation of the layered perovskite structure. Solvent annealing was then performed by holding the sample face down over a petri dish of DMF for 15 seconds at room temperature.

The samples were annealed at 100° C. for 5 minutes and transferred to a thermal evaporator. 50 nm of 1,3,5-tri[(3-pyridyl)-phen-3-yl]benzene (TmPyPB) was deposited via thermal evaporation to form the electron transporting layer. Finally, 1 nm of LiF and 100 nm of aluminum were evaporated through a metal shadow mask to form the circular top contact, which had a diameter of 1.5 mm. Completed devices were then tested in air.

Figure 1D:
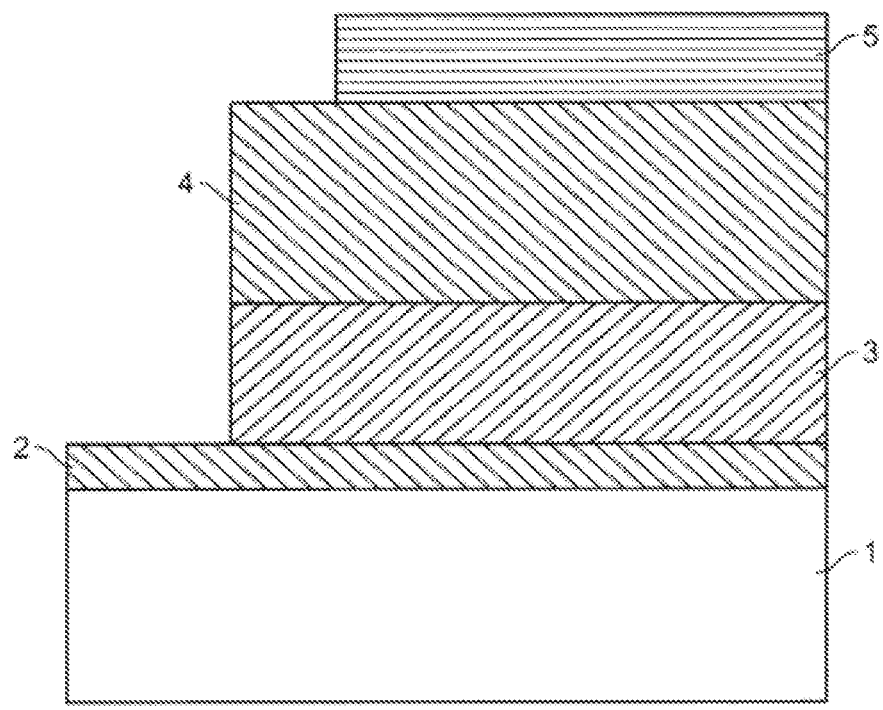

Referring to FIG. 1D, a light emitting device can have a structure in which a first electrode 2, an first layer 3 in contact with the electrode 2, an optional second layer 4 in contact with the layer 3, and a second electrode 5 in contact with the second layer 4 (or layer 3 in the absence of layer 4). First layer 3 can be a hole transporting layer and second layer 4 can be an electron transporting layer. At least one layer can be non-polymeric. The layers can include an inorganic material. One of the electrodes of the structure is in contact with a substrate 1. Each electrode can contact a power supply to provide a voltage across the structure. Electroluminescence can be produced by the emissive layer of the structure when a voltage of proper polarity is applied across the heterostructure. The layer 3 can include nanocrystals.

Figure 2A:
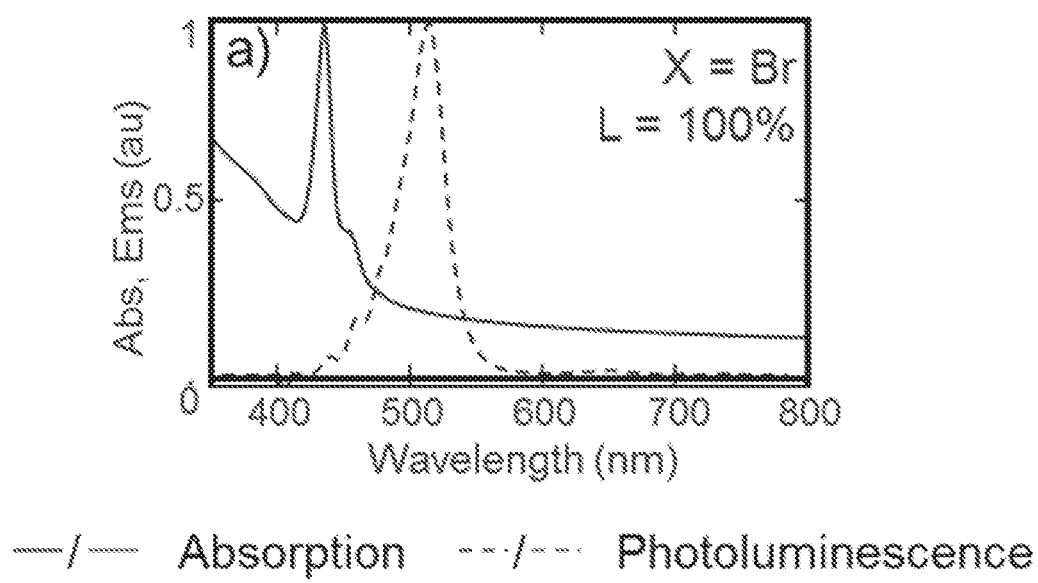
FIGS. 2A-2D represent absorption (solid line) and photoluminescence (dashed line) of the layered methylammonium lead halide perovskite films used in our devices, where X is the halide used in the mixture and L is the stoichiometric excess of the butylammonium ligand species separating the layers (stoichiometric=100%). Clear quantum confinement and blue-shifting of both the absorption and emission from bulk values is observed, and greater ligand excess drives emission toward thinner (lower n) (bluer) layers.

A facile way to change the emission wavelength of layered perovskites is by changing the chemical composition or thickness of the perovskite sheets. See, Weidman, M. C. et al. *ACS Nano* 2016, 7830-7839. This allows one to easily tune the emission over the visible range by simply choosing different precursors and precursor ratios. In FIGS. 2A-2D, the absorption and emission spectra are shown for several different methylammonium lead bromide and methylammonium lead iodide layered perovskites, using butylammonium as the interlayer ligand. In FIG. 2A, we present the absorption and emission spectrum of a stoichiometric n=2 lead bromide thin film. The absorption is successfully dominated by a large n=2 peak at 436 nm and a smaller n=3 shoulder. The emission, however, is dominated by a green peak centered near 520 nm, which results from excitonic energy funneling to lower energy (thicker) layers in the film. See, Yuan, M. et al. *Nat. Nanotechnol.* 2016, 11, 872-877. Small shoulders from n=2 and n=3 layers are also observed in the photoluminescence spectrum, but their contribution is weaker. This may originate, in part, from higher photoluminescence quantum efficiencies in larger nperovskite layers (n>3). See, Sichert, J. A. et al. *Nano Lett.* 2015, 15 (10), 6521-6527, Bekenstein, Y. et al. *J. Am. Chem. Soc.* 2015, 137 (51), 16008-16011, and Hintermayr, V. A. et al. Tuning the Optical Properties of Perovskite Nanoplatelets through Composition and Thickness by Ligand-Assisted Exfoliation. *Adv. Mater.* 2016, 28, 9478.

Figure 2B:
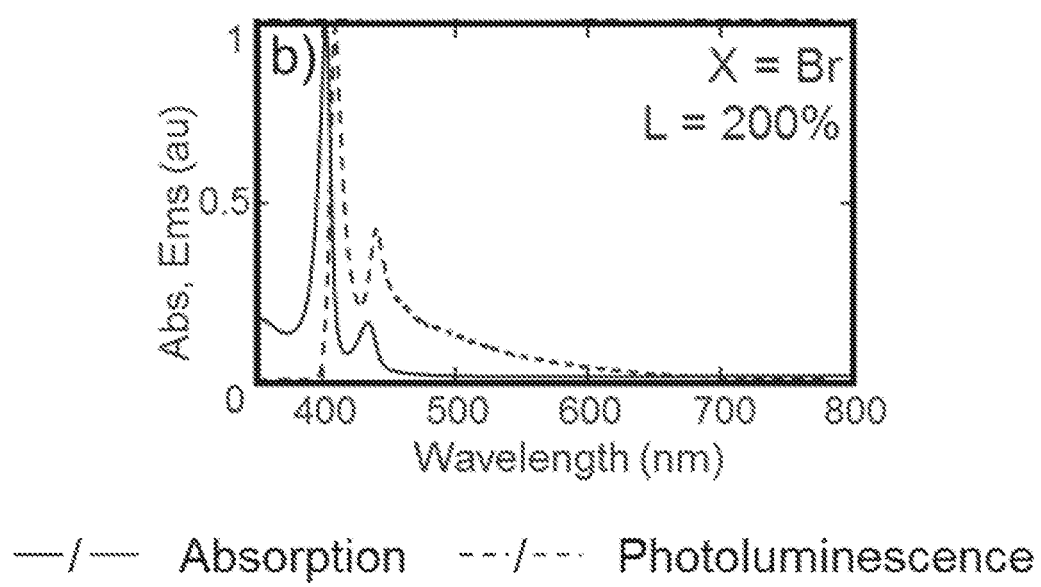
Figure 2C:
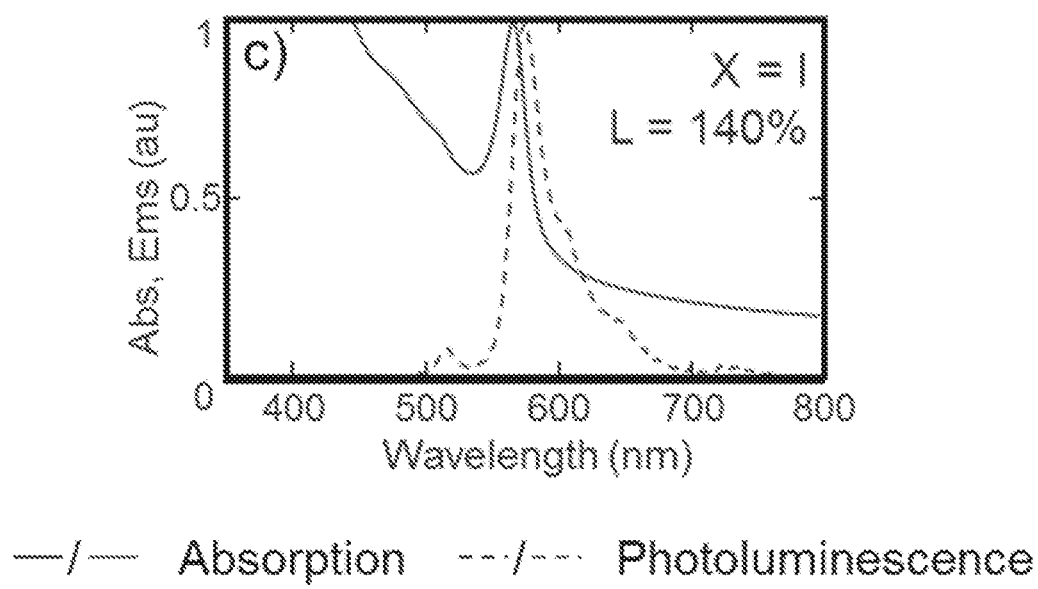
Figure 2D:
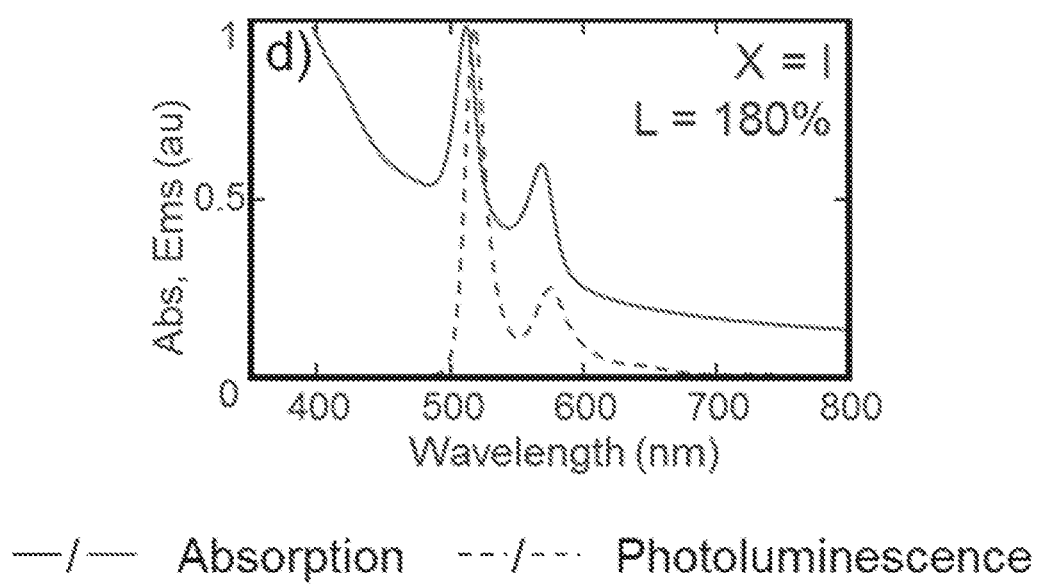

To combat energy funneling and stabilize the formation of smaller n perovskite layers, excess ligands were added to the precursor solution. In FIG. 2B, results are shown for L=200% of the stoichiometric ligand quantity. In these films, the absorption and emission spectrum is dominated by n=1 (403 nm) and n=2 layers. We demonstrate similar effects in the iodide system, FIGS. 2C-2D, where L=140% is utilized for red emission from the iodide n=2 peak (570 nm) and L=180% for orange emission from a mix of the n=2 and n=1 (514 nm) peaks. This effect can be understood by considering the surface area-to-volume ratio in these samples (see illustration in FIG. 1A): smaller n samples require more ligand molecules per perovskite unit cell, and providing a stoichiometric excess helps suppress the formation of thicker perovskite layers. Thus, the excess ligand ratio is a powerful handle for tuning the emission spectrum of layered perovskite films.

Figure 2E:
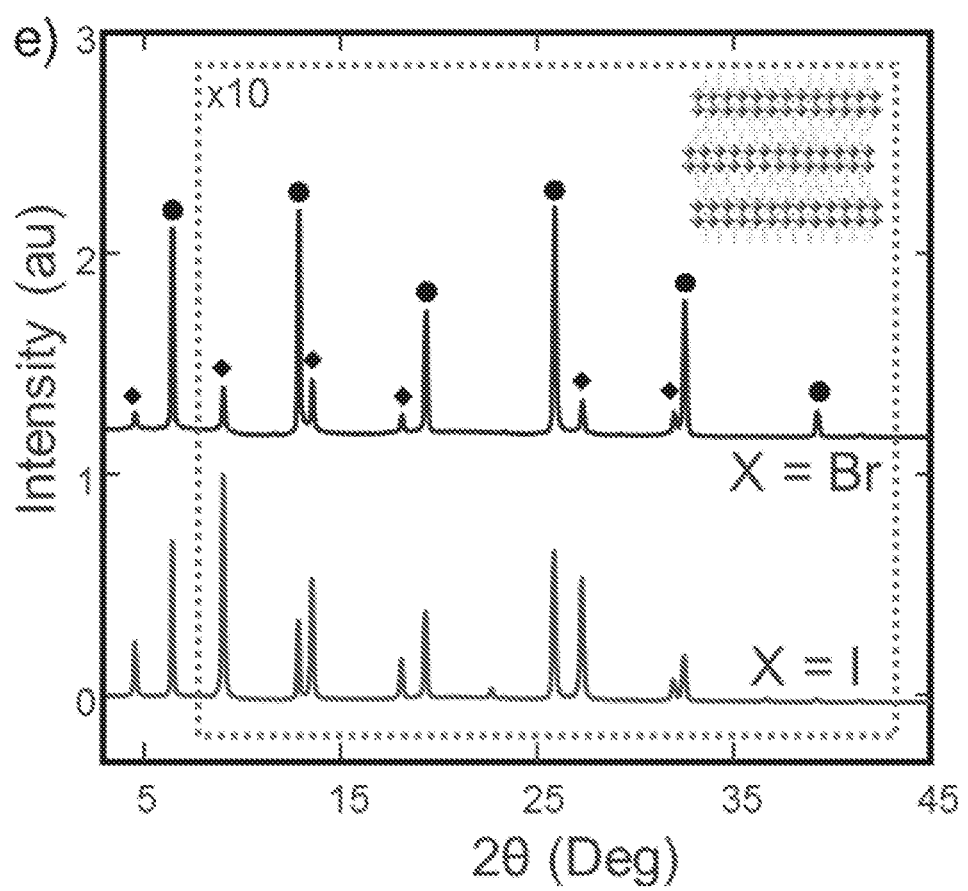
FIG. 2E represents x-ray diffraction measurements, showing periodic reflections at 4.6° (1.94 nm d-spacing) and 6.5° (1.36 nm d-spacing), corresponding to the thickness of the n=2 (diamonds) and n=1 (circles) layered perovskites, respectively.

To further prove the layered structure of these materials, X-ray diffraction (XRD) was used, shown in FIG. 2E. The n=2 films, both bromide and iodide, show two sets of periodic peaks. One set has a periodicity of 4.6 degrees, corresponding to a layer with a spacing of 1.94 nm, consistent with the thickness of the n=2 layered perovskites (~1.2 nm) plus the ligand spacers. See, Weidman, M. C. et al. *ACS Nano* 2016, 7830-7839, Tabuchi, Y et al. *J. Phys. Chem. Solids* 2000, 61 (6), 837-845, and Cao, D. H. et al. *J. Am. Chem. Soc.* 2015, 137 (24), 7843-7850. These are labeled with diamonds in FIG. 2E. The other set has a periodicity of 6.5 degrees, corresponding to an n=1 layer spacing of 1.36 nm, which is 0.58 nm—or one perovskite unit cell—thinner than the n=2 spacing. These n=1 peaks are labeled with circles. As with absorption, this demonstrates that our films are mostly a mix of n=1 and n=2 layers. In combination with the blue-shifted emission and absorption, the XRD results provide conclusive evidence for the formation of layered perovskites films containing sheets less than two unit cells in thickness.

Figure 3A:
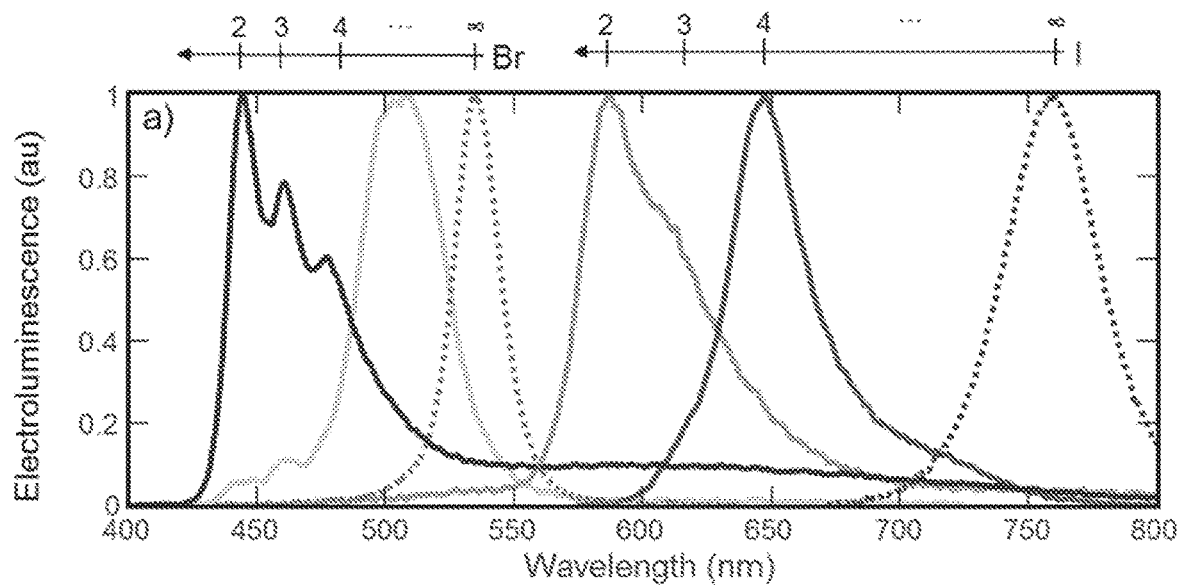
FIGS. 3A-3C represent the following.

The strategy of tuning ligand excess was used to fabricate different colored LEDs. Electroluminescence (EL) curves from four different devices are presented in FIG. 3A. The L=200% bromide device (blue) shows clear electroluminescence from the n=2, n=3, and n=4 peaks in the layered perovskites. The L=100% bromide device shows a shoulder of the same peaks, but is dominated by emission from lower energy layers. Both devices, however, are significantly blue-shifted from the bulk bromide peak (green dashed line, photoluminescence from bulk-like nanocrystals). This result clearly demonstrates that quantum confinement via layered perovskites is a strong path forward for blue light emitting perovskite LEDs. Similarly, the L=180% iodide device demonstrates orange emission from the n=2 and n=3 layers, while the L=140% is red-shifted to the n=4 layer, producing red electroluminescence. Both devices are again well blue-shifted from the bulk iodide peak (dark red dashed line, photoluminescence from bulk-like nanocrystals). In comparing FIGS. 2A-2D and FIG. 3A, electroluminescence trends were observed to activate larger n layers and inactivate the n=1 layer relative to the photoluminescence. By carefully tuning the thickness and ligand content of the layered perovskites, LEDs can be built that span the entire visible spectrum.

Figure 3B:
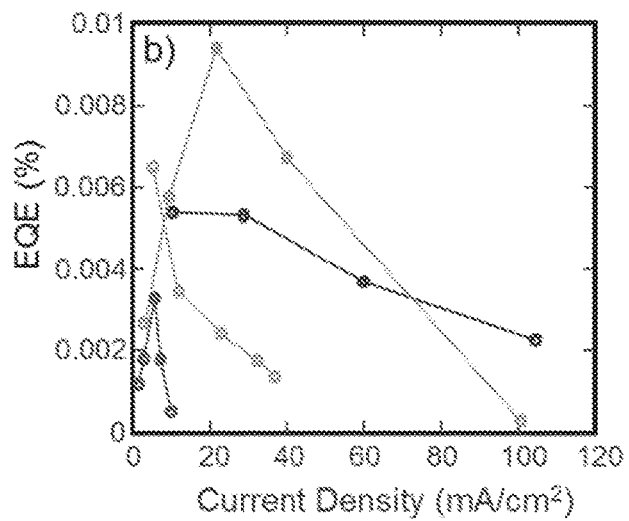
Figure 3C:
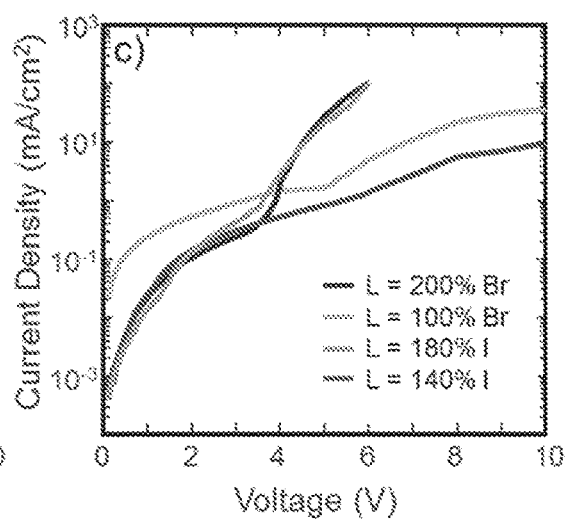
Figure 3D:
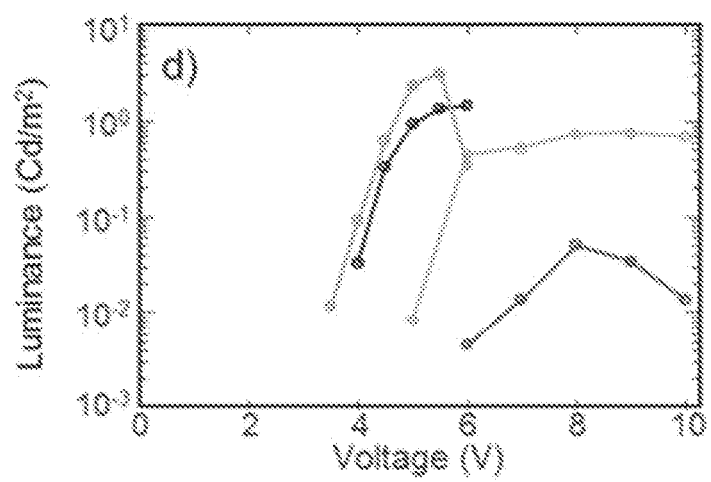
FIG. 3D luminance.
Figure 3E:
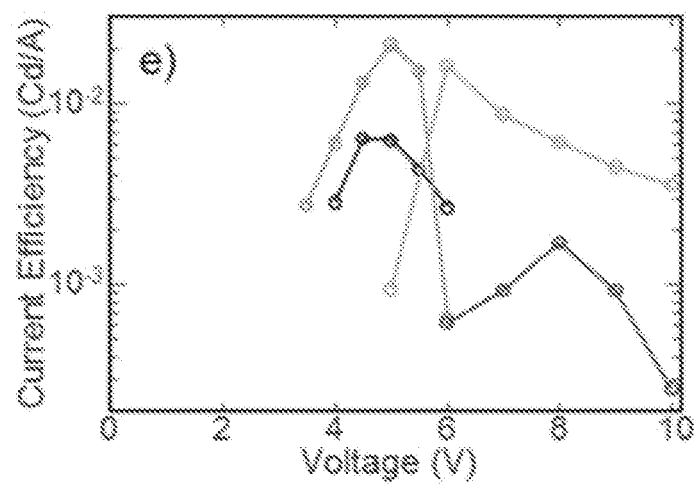
FIG. 3E current efficiency curves of the same devices.

In FIGS. 3B-3C, the external quantum efficiencies (EQEs) and current-voltage curves of the devices are presented. The EQEs of the devices remain low, with the L=180% iodide device peaking just below 0.01%. The L=200% bromide device, at a peak EQE of 0.0054%, is already competitive with chlorine-based blue perovskite LEDs and shows that quantum confinement via layering has the potential to open a new avenue for achieving blue electroluminescence in the perovskite space. See, Sadhanala, A. et al. *Nano Lett.* 2015, 15 (9), 6095-6101 and Sadhanala, A. et al. *Nano Lett.* 2015, 15 (9), 6095-6101.

Unlike perovskite nanocrystals which have the benefit of photoluminescence quantum yields (PLQYs) approaching 100%, the PLQY of the layered perovskites presented here are still quite low, with measurements of 6% and 1.1% for the bromide and iodide systems, respectively, measured in solution. See, Sadhanala, A. et al. *Nano Lett.* 2015, 15 (9), 6095-6101, Wei, S., et al. Pan, D. *Chem. Commun.* 2016, 52 (45), 7265-7268, and Weidman, M. C. et al. *ACS Nano* 2016, 7830-7839. Going forward, efforts must be made to increase the PLQY of these layered perovskites while maintaining their quantum confinement properties.

To gain a further understanding of the operation of the LEDs, the performance of the layered perovskites was studied under an applied electric field. To do so, an electric field was applied within the device and monitor its effect on the photoluminescence. A lock-in amplifier and intensity-modulated light source were utilized to isolate the photoluminescence, filtering out the quasi-steady state electroluminescence signal and any background. All tests are performed in air on completed, unpackaged devices.

Figure 4A:
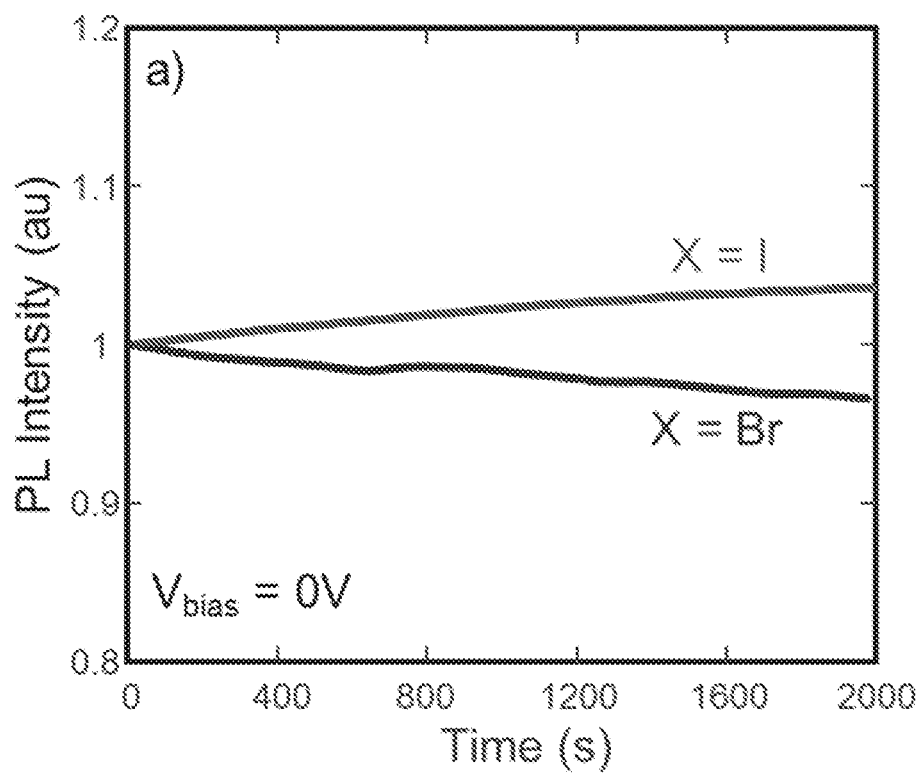
FIGS. 4A-4B represent.

The stability of the material was first tested without any applied field, shown in FIG. 4A. Both material systems show stability to UV irradiation; the bromide sample loses only 4% of its emission after 30 minutes of illumination, while the iodide sample slightly increases in emission intensity.

Figure 4B:
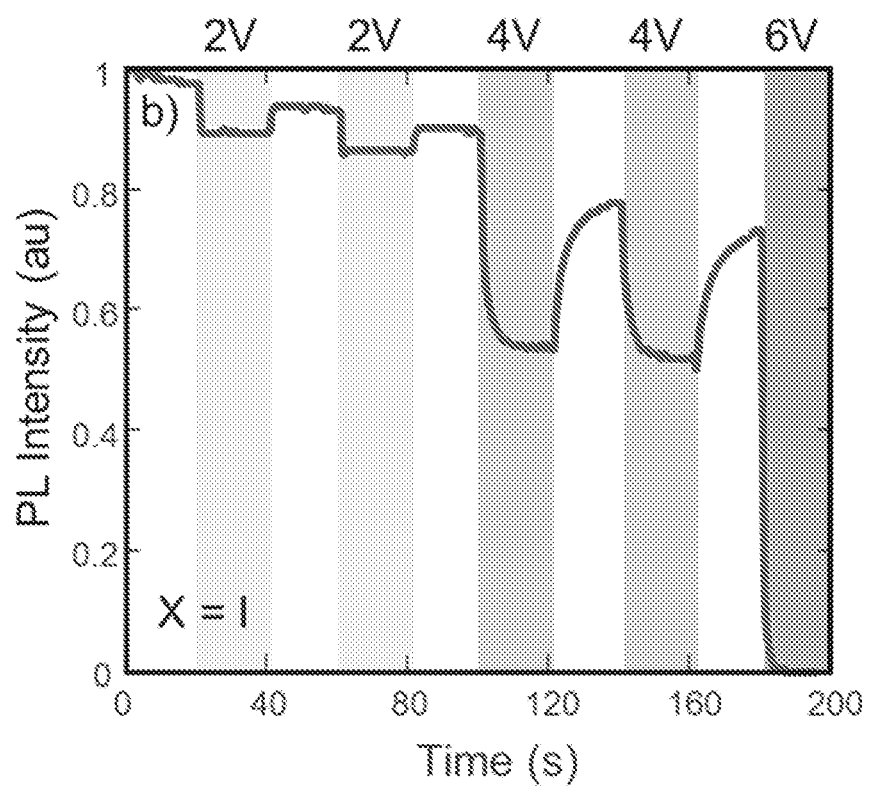
Figure 5:
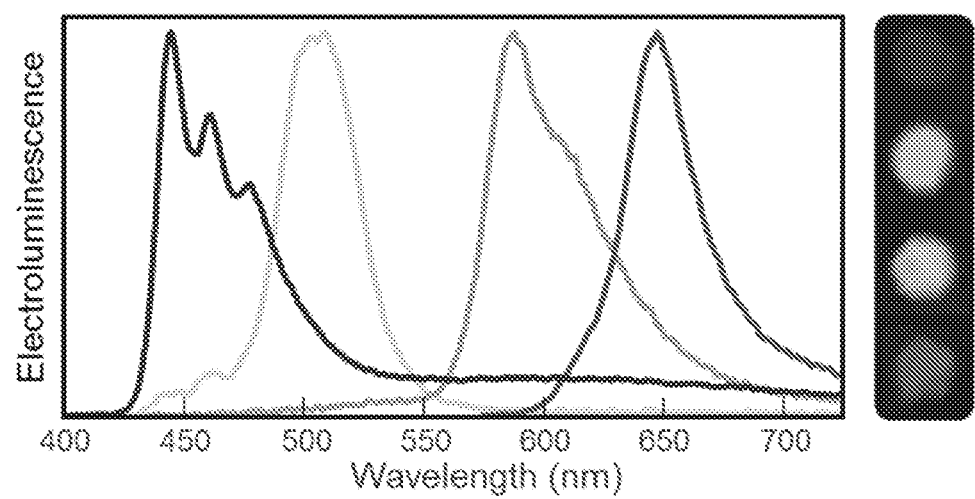
FIG. 5 represents a depiction of certain selected colors of emission attained from tunable light emitting diodes described herein.

The measurement was then repeated while applying a quasi-steady state electric field as shown in FIG. 4B. In red shading the time during which the electric field is applied is indicated. A relatively mild 2 V field drops the PL efficiency of the device by 8-10%, much of which is recovered after turning the device off. Of particular interest is the reaction of the photoluminescence to 4 V applied field. Here, the device loses 40% of its photoluminescence upon application of the field, but takes 8 seconds before stabilizing into its lower value. Again, most of this signal is recoverable upon extinction of the field, but only on a timescale of seconds. This could be another example of the well-known ion migration in bulk perovskites,[34] but further studies are needed to understand this behavior more completely. When 6 V is applied to the device, the photoluminescence immediately drops to zero and does not recover, even after turning the field off. Clearly, a large applied field severely degrades the layered perovskites. This is likely in large part responsible for the rapid reduction in the EQE with increasing bias, FIG. 3B. Finding a way to mitigate this degradation could lead to a large efficiency enhancement in this material system.

Electroluminescence has been demonstrated ranging from 440 nm to 650 nm in layered perovskite light-emitting devices, spanning the visible spectrum. The emission spectrum can be tuned easily by changing the ligand concentration in the precursor solution, and layer perovskite devices can suffer from reversible electric field-induced degradation at mild fields and terminal degradation at larger ones. Engineering a solution to this degradation and improving the photoluminescence quantum efficiency of the smaller n layered perovskites will be critical steps needed to build highly efficient, solution-processable LEDs that span the visible spectrum.

Experimental

Materials Synthesis. Chemicals: Lead (II) bromide ($PbBr_2$) (Sigma-Aldrich, 99.999%), lead (II) iodide solution ($PbI_2$), 0.55 M in DMF (Sigma-Aldrich), n-butylammonium iodide (BAI) (Sigma-Aldrich), methylammonium bromide (MABr) (Sigma-Aldrich), methylammonium iodide (MAI) (Sigma-Aldrich), N,N-dimethylformamide (DMF) (Sigma-Aldrich, anhydrous, 99.8%). Butylammonium bromide (BABr) was synthesized according to literature methods.[16] To synthesize BABr, 120 mmol of butylamine (Sigma-Aldrich, 99.5%) was reacted with 130 mmol of hydrobromic acid (Sigma-Aldrich, 48%) in 100 mL ethanol (VWR, 100%) at room temperature for two hours. The volatiles were then removed from the products using a rotary evaporator, leaving behind the solids. The solids were washed several times with diethyl ether (Sigma-Aldrich, ≥99.7%) and recrystallized once using acetone as the recrystallization solvent. The white powder was washed a final time with diethyl ether before being brought into an oxygen and water-free glovebox.

The ligand and cation salts (BAX, MAX) were dissolved in DMF inside a glovebox at a concentration of 2.0 M. The metal salts ($PbBr_2$, $PbI_2$) were prepared at 0.5 M concentrations in DMF, also inside a glovebox. Mild heating to 60° C. was used to ensure full dissolution of the $PbBr_2$ solution. For n=2 layered perovskites ($BA_2[MAPbX_3]PbX_4$), 2 parts of 2.0 M BAX solution was mixed with 8 parts of 0.5 M $PbX_2$ solution and 1 part of 2.0 M MAX solution. The solutions were diluted by a factor of 4 prior to use in devices.

PEDOT:PSS and LiF were purchased from SigmaAldrich and used as received. TmPyPB was purchased from Luminescence Technology Corp. and used as received. Aluminum pellets was purchased from Kurt Lesker and used as received.

Bulk-life nanocrystals were synthesized by combining 1 part MAX with 1 part $PbX_2$ of 0.1 M solutions in DMF. 2.0 uL of this solution was then added to 10 mL of toluene while stirring, which led to immediate crystallization of bulk-like nanocrystals.

XRD. X-ray diffraction (XRD) was performed on a Rigaku Smartlab with Cu Kα source operating at 45 kV and 200 mA. Thin films were prepared on glass substrates for these measurements and scanned from 3 to 50 degrees.

Absorption. The layered perovskites were spun onto 1" quartz slides under the same conditions as the device synthesis. The absorption was measured with a Cary 500i UV-Vis-NIR Dual Beam Spectrophotometer.

Photoluminescence and Electroluminescence. The layered perovskites were spun onto 1" quartz slides under the same conditions as the device synthesis. Photoluminescence and electroluminescence curves were both measured with a SpectraPro SP2300 spectrometer. PeLEDs were powered at the steady state with a Keithley 2400. Stability studies were performed using a 365 nm LED at approximately 400 mW/cm$^2$ excitation density.

EQE curves. The EQE curves were measured using an Agilent 4156C. Voltage was sourced at a single data point and the emission current was measured with a photodetector (ThorLabs FDS1010) physically pressed to the sample. At least 10 seconds were waited between each data point to allow the sample to recover from electric-field induced degradation (see FIGS. 4A-4B.

SEM. Devices were fabricated without the shadow mask to give a large active area, then scored with a diamond scribe and snapped. SEM measurements were performed on a Zeiss Merlin operating at 20 kV.

Photoluminescence Quantum Yield. The PLQYs were measured with an integrating sphere (LabSphere, CSTM-QE-060-SF), a 365 nm LED (Thorlabs, M365L2-C5), and a CCD spectrometer (AVANTES, AvaSpec-2048XL). A 360 nm bandpass filter (Thorlabs, FB360-10) was inserted between the LED and thin films of layered perovskites to make sure that their spectra do not overlap. The thin films were prepared by mixing precursor salt solutions in the ratios as described above. The solutions were diluted by 40-60 times to obtain samples with less than 10% absorption. The solutions were then spun cast at 3000 rpm for 60 s on cover glass.

AFM. Atomic force microscopy (AFM) was performed using a Nanonics MV2000. Thin films of layered perovskites were prepared by the same method as in the PLQY measurement but with dilution by a factor of 4.

Transient Photoluminescence Spectroscopy. Transient photoluminescence measurements were performed by timecorrelated single-photon counting. Thin films of layered perovskites were positioned inside a cryostat and excited by a 405 nm pulsed diode laser (LDH-D-C 405M, Picoquant) operating at 1 MHz. The laser beam was focused onto the thin films through the cryostat window using a 100 mm focal length lens. The photoluminescence was collected using the same lens, passed through a 405 nm dichroic mirror and a 405 nm long-pass filter (405 nm EdgeBasic, Semrock). It was then focused onto a silicon avalanche photodiode (PDM50, Micro Photon Devices) connected to a counting board (PicoHarp 300, Picoquant) for time-correlated single-photon counting. All measurements were done at room temperature and under vacuum.

Each of the references cited herein is incorporated by reference in its entirety.

Other embodiments are within the scope of the following claims.

What is claimed is:

1. A light emitting device comprising: a first electrode; a second electrode; and a layered perovskite between the first electrode and the second electrode wherein the layered perovskite has the formula $L_2[MAPbX_3]_{n-1}PbX_4$ where n represents a number of metal-halide layers in thickness, L is an alkyl ammonium, MA is an organic cation, and X is bromide or iodide.

2. The light emitting device of claim 1, wherein the layered perovskite includes a lead bromide, a lead iodide, or a mixture thereof.

3. The light emitting device of claim 1, wherein the layered perovskite has 1, 2 or 3 layers.

4. A method of adjusting the color of emission from a light emitting device comprising:
   selecting a layered perovskite; and
   depositing the layered perovskite onto a first electrode wherein the layered perovskite has the formula $L_2[MAPbX_3]_{n-1}PbX_4$ where n represents a number of metal-halide layers in thickness, L is an alkyl ammonium, MA is an organic cation, and X is bromide or iodide;

contacting a second electrode with the layered perovskite opposite the first electrode.

5. The method of claim 4, wherein selecting the layered perovskite includes tuning the thickness of the layers of the perovskite.

6. The method of claim 4, wherein selecting the layered perovskite includes choosing anions to arrive at the color of emission.

7. The method of claim 6, wherein choosing anions includes mixing halides.

8. The method of claim 4, wherein selecting the layered perovskite includes choosing a number of layers of the layered perovskite to arrive at the color of emission.

9. The method of claim 8, wherein the layered perovskite is selected to have 1, 2 or 3 layers.

* * * * *